(12) United States Patent
Miyamoto

(10) Patent No.: US 12,154,298 B2
(45) Date of Patent: Nov. 26, 2024

(54) COLOR ESTIMATION DEVICE, COLOR ESTIMATION METHOD, AND PROGRAM

(71) Applicant: CASIO COMPUTER CO., LTD., Tokyo (JP)

(72) Inventor: Naotomo Miyamoto, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 481 days.

(21) Appl. No.: 17/630,800

(22) PCT Filed: Jul. 27, 2020

(86) PCT No.: PCT/JP2020/028749
§ 371 (c)(1),
(2) Date: Jan. 27, 2022

(87) PCT Pub. No.: WO2021/020355
PCT Pub. Date: Feb. 4, 2021

(65) Prior Publication Data
US 2022/0277487 A1 Sep. 1, 2022

(30) Foreign Application Priority Data

Jul. 29, 2019 (JP) .................................. 2019-138469
Feb. 28, 2020 (JP) .................................. 2020-032572

(51) Int. Cl.
*H04N 5/335* (2011.01)
*G01J 3/50* (2006.01)
*G06T 7/90* (2017.01)
*G06V 40/16* (2022.01)
*H10K 59/30* (2023.01)

(52) U.S. Cl.
CPC ..................... *G06T 7/90* (2017.01);
*G01J 3/50* (2013.01); *G06V 40/162* (2022.01);
*H10K 59/30* (2023.02)

(58) Field of Classification Search
CPC ........................................ H10K 59/30
See application file for complete search history.

(56) References Cited

U.S. PATENT DOCUMENTS

| 9,008,520 B2 * | 4/2015 | Yokoi | ................ H04B 10/1149 398/118 |
| 10,218,439 B2 * | 2/2019 | Kikuchi | ................ H04N 9/643 |
| 2008/0212892 A1 * | 9/2008 | Doida | ....................... G06T 5/40 348/E9.053 |
| 2016/0286227 A1 * | 9/2016 | Miyamoto | ............. H04N 23/71 |

FOREIGN PATENT DOCUMENTS

| JP | 2000-222673 A | 8/2000 |
| JP | 2014-236421 A | 12/2014 |
| JP | 2016-139998 A | 8/2016 |
| WO | 2006/134923 A1 | 12/2006 |

* cited by examiner

Primary Examiner — Gary C Vieaux
(74) Attorney, Agent, or Firm — Fitch, Even, Tabin & Flannery LLP

(57) ABSTRACT

When estimating color for a marker candidate region that is smaller in size than a DeBayer filter, a sever estimates the color of the marker candidate region using HSV average values that are the average values of the hue H, the saturation S, and the brightness V of the marker candidate region, in consideration of the Bayer array of color filters. Furthermore, the server appropriately corrects the HSV average values and converts the pixel format to convert the HSV average values to RGB (RGB average value values), and sets the RGB average values in all pixels of a marker region.

13 Claims, 10 Drawing Sheets

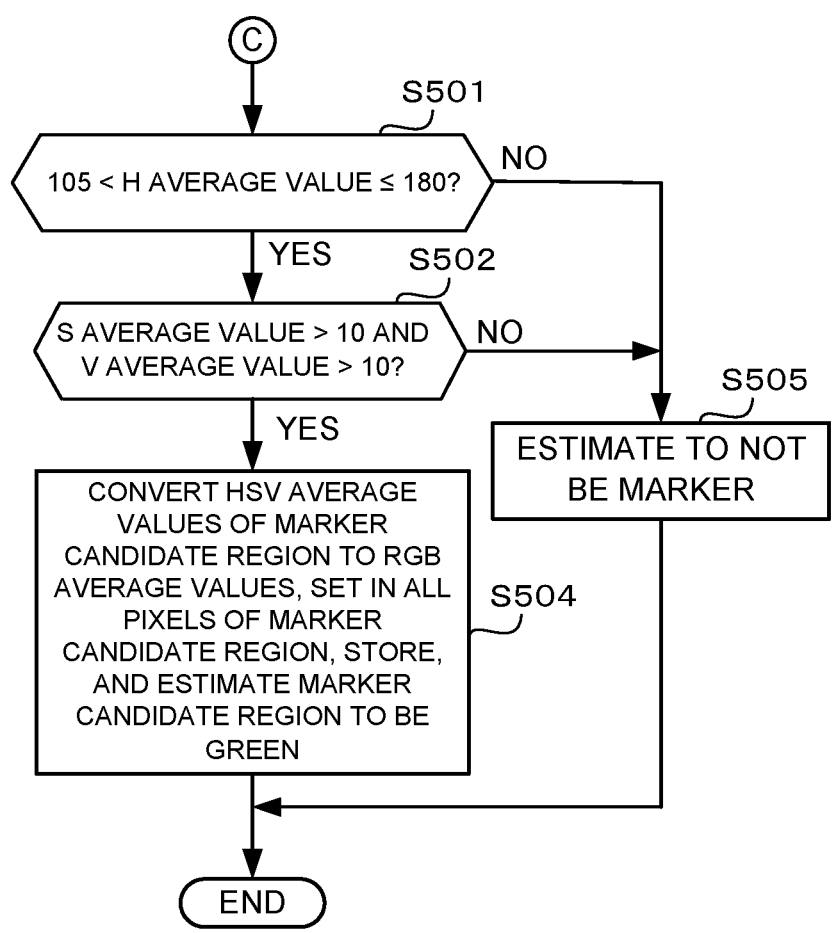

COLOR ESTIMATION DEVICE, COLOR ESTIMATION METHOD, AND PROGRAM

CROSS-REFERENCE TO RELATED APPLICATIONS

This application is a U.S. national phase application filed under 35 U.S.C. § 371 of International Application No. PCT/JP2020/028749, filed Jul. 27, 2020, which is based upon and claims the benefit of priority from the prior Japanese Application No. 2019-138469, filed Jul. 29, 2019 and prior Japanese Application No. 2020-032572, filed Feb. 28, 2020.

FIELD OF THE INVENTION

The present disclosure relates to color estimation device, a color estimation method, and a program.

BACKGROUND OF THE INVENTION

Techniques have been conceived in which a marker modulates information by the brightness and color in the wavelength region of visible light to emit light and transmit information. Moreover, techniques are known for receiving this modulated visible light by an image sensor of a camera, and associating demodulated information with the position in the image sensor where the light is received (for example, see Patent Literature 1).

CITATION LIST

Patent Literature

Patent Literature 1: Unexamined Japanese Patent Application Publication No. 2016-139998

SUMMARY OF INVENTION

However, when the distance between the marker and the camera is great and, consequently, the image of the light emitted by the marker is captured at a predetermined size or smaller on the light receiving surface of the imaging element, there is a problem in that the color (emission color) of the image of that light is significantly affected by the color of one of the red, green, and blue (RGB) arrays of color filters, and the emission color cannot be correctly recognized.

The present disclosure is made with the view of the above situation, and an objective of the present disclosure is to correctly estimate the color of an image of a size for which color identification is difficult.

A color estimation device according to the present disclosure that achieves the objective described above includes:
light receiving means with a plurality of arranged light receiving elements for which a color to which received light belongs is identified from a light receiving position; and
estimation means for estimating, in a case in which a position of the light receiving element having received light is a position other than where the color to which the received light belongs is identifiable, a color to which the light belongs, based on a brightness of the received light.

A color estimation method according to the present disclosure that achieves the objective described above includes:
receiving light by a plurality of arranged light receiving elements for which a color to which received light belongs is identified from a light receiving position; and
in a case in which a position of the light receiving element having received in the receiving is a position other than where the color to which the received light belongs is identifiable, estimating the color to which the light belongs, based on a brightness of the received light.

A program according to the present disclosure that achieves the objective described above causes a computer to function as:
light receiving means with a plurality of arranged light receiving elements for which a color to which received light belongs is identified from a light receiving position; and
estimation means for estimating, in a case in which a position of the light receiving element having received light is a position other than where the color to which the received light belongs is identifiable, a color to which the light belongs, based on a brightness of the received light.

According to the present disclosure, it is possible to correctly estimate the color of an image of a size for which color identification is difficult.

BRIEF DESCRIPTION OF DRAWINGS

FIG. 11 is a flowchart illustrating a detailed example of a fourth operation of the color estimation by the server according to the embodiment.

DESCRIPTION OF EMBODIMENTS

Hereinafter, as an information processing system according to an embodiment of the present disclosure, a visible light communication system is described while referencing the drawings.

Figure 1:
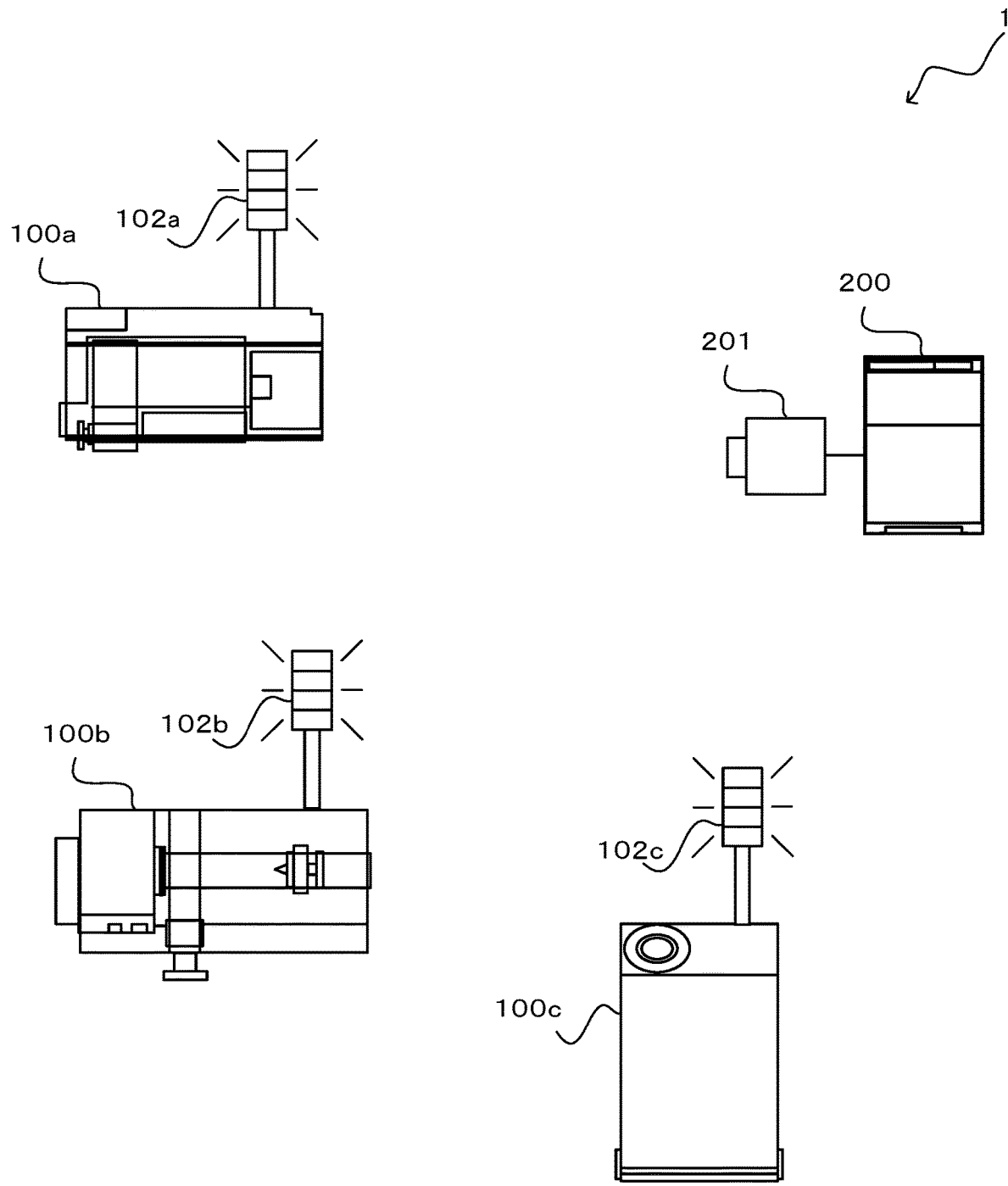
FIG. 1 is a drawing illustrating an example of a visible light communication system according to an embodiment of the present disclosure.

FIG. 1 is a drawing illustrating the configuration of a visible light communication system. As illustrated in FIG. 1, a visible light communication system 1 includes a server 200, mobile devices 100a, 100b, 100c, and a server 200. Hereinafter, when not limiting to the mobile device 100a, 100b, or 100c individually, the mobile devices 100a, 100b, 100c are appropriately referred to as the "mobile device 100." The mobile device 100a includes a light emitting diode (LED) 102a that is a marker. The mobile device 100b includes an LED 102b. The mobile device 100c includes an LED 102c. Hereinafter, when not limiting to the LED 102a, 102b, or 102c individually, the LEDs 102a, 102b, 102c are appropriately referred to as the "LED 102." The server 200 includes an imager 201.

In the present embodiment, the LED 102 in the mobile device 100 transmits information by emitting light corresponding to an identification (ID) or the like of the mobile device 100. Here, the ID or the like is information to be transmitted. Meanwhile, the imager 201 in the server 200 carries out imaging, and the server 200 acquires the ID of the mobile device 100 from the image of the light obtained by the imaging.

Figure 2:
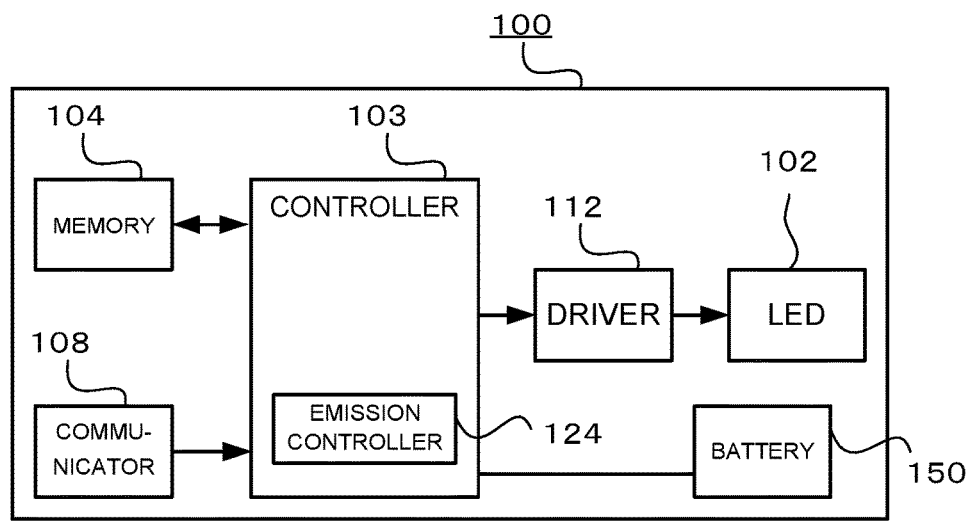
FIG. 2 is a drawing illustrating an example of the configuration of a mobile device according to the embodiment.

FIG. 2 is a drawing illustrating an example of the configuration of the mobile device 100. As illustrated in FIG. 2, the mobile device 100 includes the LED 102, a controller 103, a memory 104, a communicator 108, a driver 112, and a battery 150.

In one example, the controller 103 includes a central processing unit (CPU). The controller 103 executes software processing in accordance with a program stored in the memory 104 to control the various functions of the mobile device 100.

In one example, the memory 104 is implemented as a random access memory (RAM), a read-only memory (ROM), or the like. The memory 104 stores various types of information (programs and the like) used in the control and the like of the mobile device 100. In one example, the communicator 108 is implemented as a local area network (LAN) card. The communicator 108 communicates with other communication devices. The battery 150 supplies, to the various components, power required for the operations of the mobile device 100.

The controller 103 functionally includes a light emission controller 124. The light emission controller 124 determines, in accordance with the ID or the like of the mobile device 100, a light emission pattern, for emitting predetermined light that includes desired information modulated to changes over time of the hue emitted by the LED 102.

Furthermore, the light emission controller 124 outputs, to the driver 112, information about the light emission pattern corresponding to the ID or the like. The driver 112 generates, in accordance with the information about the light emission pattern from the light emission controller 124, a driving signal for changing, over time, the hue, the brightness, or the like of the light emitted by the LED 102. In accordance with the driving signal output from the driver 112, the LED 102 emits light for which the hue, the brightness, or the like changes over time. The emission color is one of red (R), green (G), and blue (B), which are the three primary colors and are colors in the wavelength band used for color modulation in visible light communication.

Figure 3:
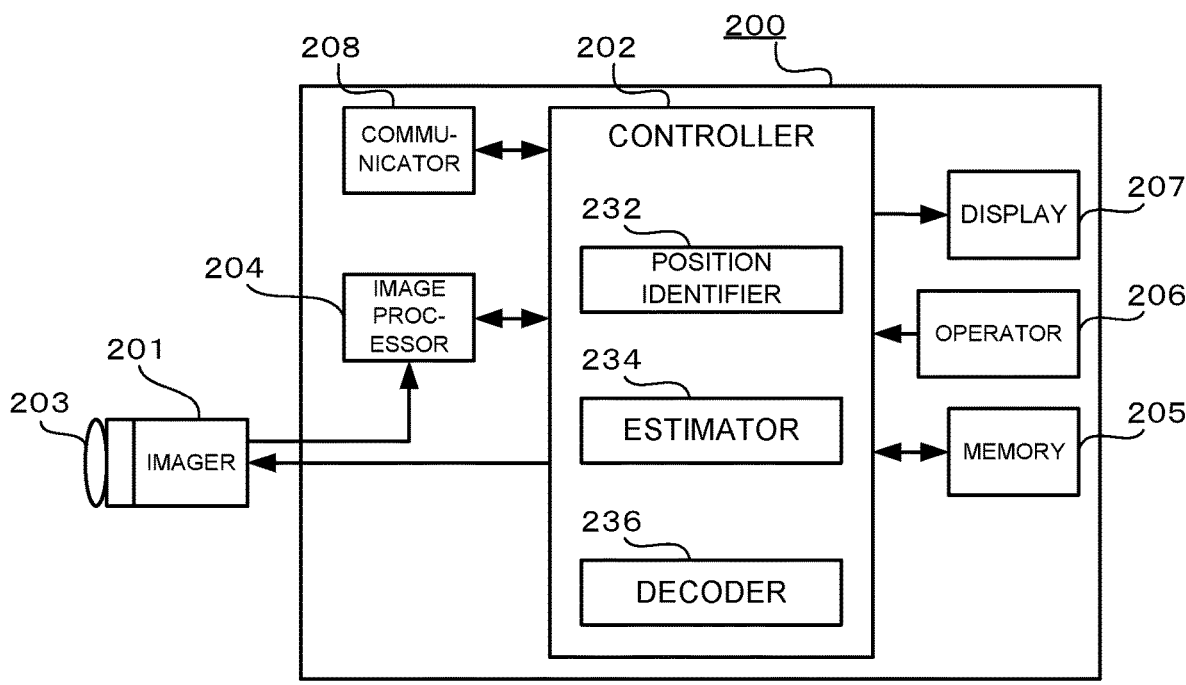
FIG. 3 is a drawing illustrating an example of the configuration of a server according to the embodiment.

FIG. 3 is a drawing illustrating an example of the configuration of the server 200. As illustrated in FIG. 3, the server 200 includes the imager 201, a controller 202, an image processor 204, a memory 205, an operator 206, a display 207, and a communicator 208.

The imager 201 includes a lens 203. The lens 203 is configured from a zoom lens or the like. The lens 203 moves due to a zoom control operation from the operator 206 and focusing control by the controller 202. An imaging field angle, an optical image, and the like captured by the imager 201 are controlled by the movement of the lens 203.

A light receiving surface of the imager 201 includes a plurality of light receiving elements arranged regularly in two dimensions. In one example, the light receiving elements are implemented as charge coupled devices (CCD), complementary metal oxide semiconductors (CMOS), or similar imaging devices. The imager 201 images (receives), on the basis of a control signal from the controller 202, an optical image received through the lens 203 at an imaging field angle that has a predetermined range, and converts an image signal in that imaging field angle to digital data to generate a frame. The imager 201 continuously carries out the imaging and frame generation over time, and outputs successive frames to the image processor 204.

Figure 4:
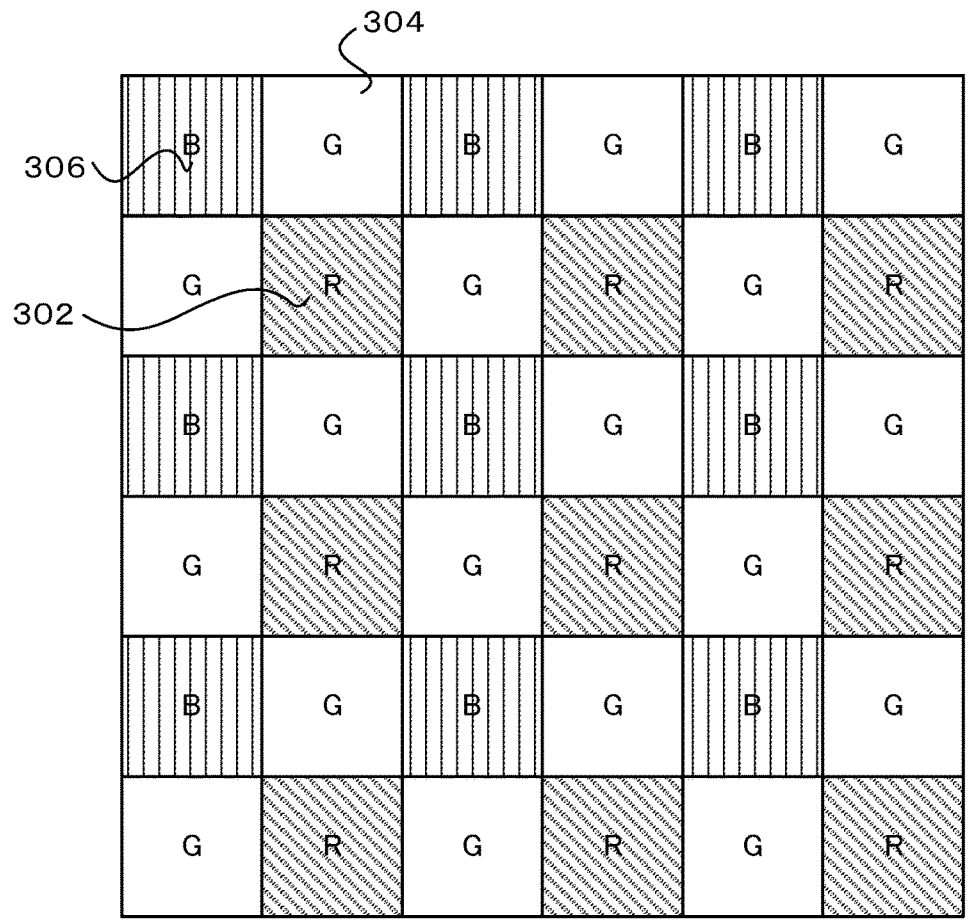
FIG. 4 is a drawing illustrating an example of a Bayer array of color filters according to the embodiment.

The light receiving surface includes a Bayer array of color filters. As illustrated in FIG. 4, the Bayer array of color filters is formed by alternately disposing, in the vertical direction, a first row in which a red filter 302 and a green filter 304 are alternately disposed in the horizontal direction, and a second row in which a blue filter 306 and the green filter 304 are alternately disposed in the horizontal direction.

The image processor 204 outputs, on the basis of a control signal from the controller 202, the frames (digital data) output from the imager 201 to the controller 202 without modification. The image processor 204 also adjusts the image quality and the image size of the frames in order to display the frames as live view images on the display 207, and outputs the adjusted frames to the controller 202. Additionally, the image processor 204 has a function of, when a control signal based on a store command operation from the operator 206 is input, encoding, in a compression encoding format such as joint photographic experts group (JPEG) or the like, or converting, to a file, the optical image in the imaging field angle of the imager 201 or in a display range displayed on the display 207. Here, the optical image is from the point in time at which the storing is commanded.

In one example, the controller 202 includes a CPU. The controller 202 executes software processes in accordance with a program stored in the memory 205 to control the various functions of the server 200 such as carrying out the operations illustrated in FIGS. 7 to 11 described later, and the like.

In one example, the memory 205 is implemented as a RAM, a ROM, or the like. The memory 205 stores various types of information (programs and the like) that is used in the control of the server 200 and the like. In one example, the communicator 208 is implemented as a LAN card. The communicator 208 communicates with external communication devices.

The operator 206 includes a ten-key, function keys, or the like, and is an interface used to input operation content of a user. The display 207 is configured from, for example, a liquid crystal display (LCD), a plasma display panel (PDP), an electro luminescence (EL) display, or the like. The display 207 displays images in accordance with image signals output from the controller 202.

The controller 202 functionally includes a position identifier 232, an estimator 234, and a decoder 236. The position identifier 232 identifies a position of a region of the light receiving surface on which the light emitted by the LED 102 in the mobile device 100 is irradiated (hereinafter referred to as the "position of light emission"). In other words, the position of light emission is the position of a region constituting a marker candidate that includes a frame of a predetermined range centered on the position of the marker.

The estimator 234 estimates if the color of the region constituting the marker candidate is any of red (R), green (G), and blue (B). The controller 202 restores, on the basis of changes of the estimated color of the region, the information such as the ID of the mobile device 100, which is transmitted in accordance with the changes. In this case, when the region of the light receiving surface is sufficiently large with respect to the red filter 302, the green filter 304, and the blue filter 306 of the color filters, the estimator 234 can easily estimate if the color of the marker region is any of red (R), green (G), and blue (B).

Figure 5A:
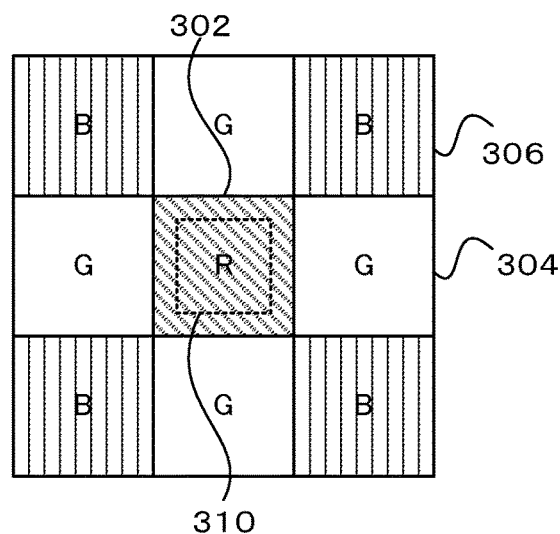
FIG. 5A is a drawing illustrating an example in which a red marker region is included in a red filter according to the embodiment.
Figure 5B:
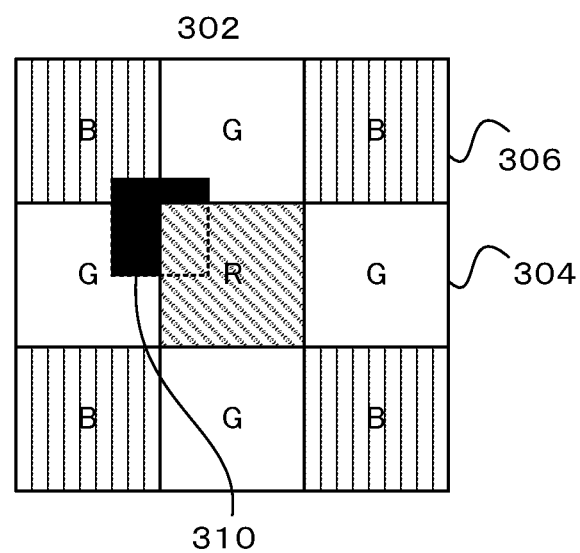
FIG. 5B is a drawing illustrating an example in which the red marker region overlaps a green filter or a blue filter according to the embodiment.
Figure 5C:
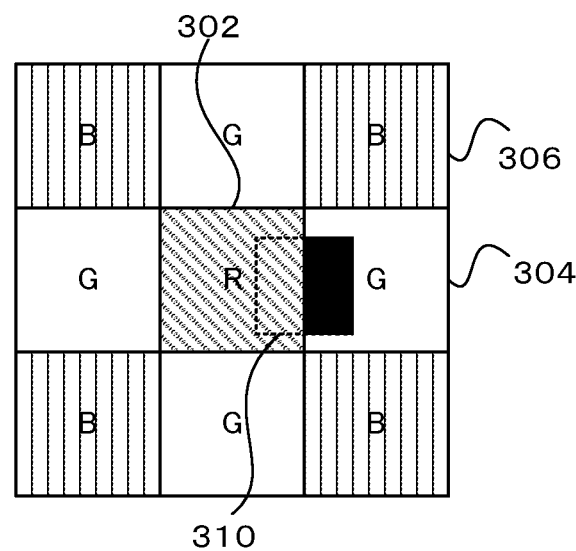
FIG. 5C is a drawing illustrating another example in which the red marker region overlaps the green filter or the blue filter according to the embodiment.

However, when the region of the light receiving surface constituting the marker candidate is smaller than the size of a DeBayer filter (n×m pixels), there are cases in which the estimator 234 cannot correctly estimate the color of the marker region as-is. Herein, the phrase "the size of a DeBayer filter" refers to the smallest size, determined by the array of color filters, required to generate a color image. As illustrated in FIGS. 5A to 5C, for example, cases are considered in which positions of the red filter 302, the green filter 304, and the blue filter 306 of the color filters, and a marker candidate region 310 that is a small region and that emits red light exist.

In FIG. 5A, the marker candidate region 310 is included in the red filter 302. In such a case, the marker candidate region 310 is red and has a brightness that is high. As such, the estimator 234 can determine that the marker candidate region 310 is red.

Meanwhile, In FIGS. 5B and 5C, the marker candidate region 310 overlaps the green filter 304 and the blue filter 306. In cases such as this, the marker candidate region 310 has a lower brightness, and has a color in which green and blue are mixed due to the green filter 304 and the blue filter 306. In particular, as illustrated in FIG. 4, since the ratio of the green filter 304 in the Bayer array is high, the color is more likely to be affected by the green filter 304.

Figure 6A:
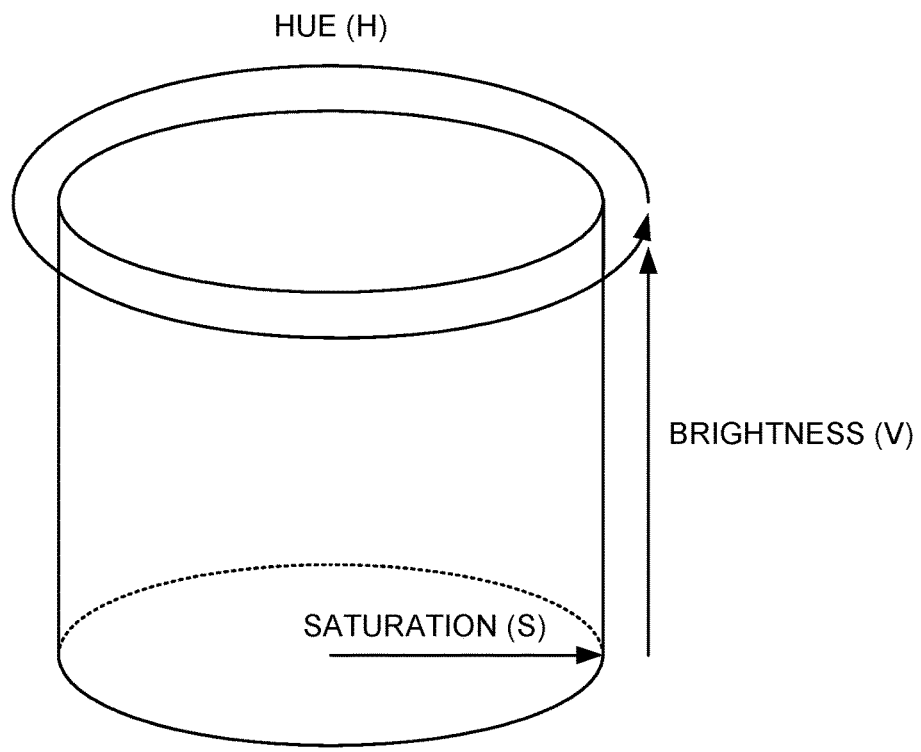
FIG. 6A is a drawing illustrating an example of a hue ring according to the embodiment.
Figure 6B:
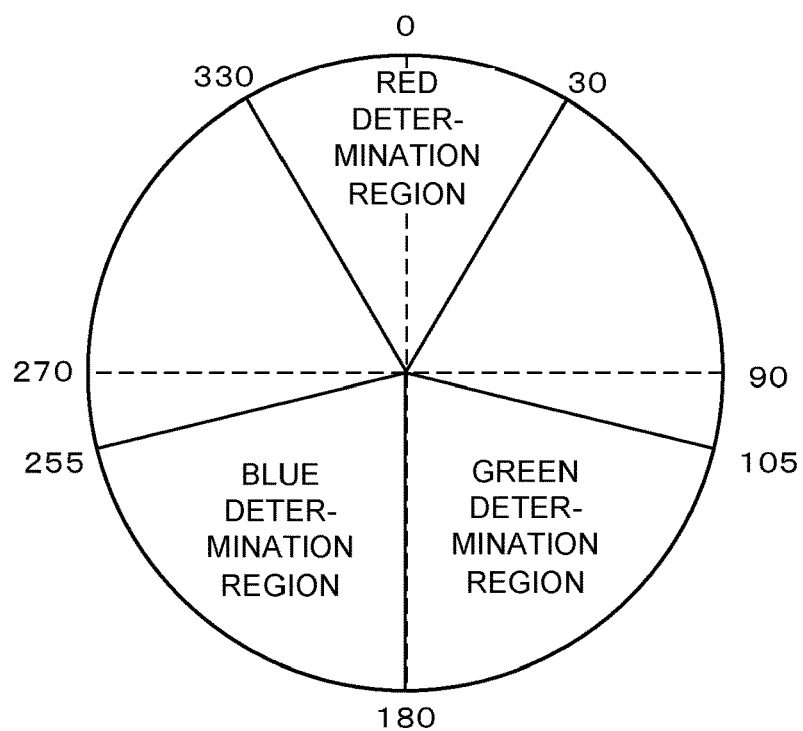
FIG. 6B is a drawing illustrating an example of a color plane according to the embodiment.

As such, in the present embodiment, the estimator 234 estimates the color of the marker candidate region in accordance with the color ring illustrated in FIG. 6A and the color plane illustrated in FIG. 6B. As illustrated in FIG. 6A, the color is identified in HSV color space by hue, brightness, and saturation, and is identified by a position in cylindrical color space. In the color ring of FIG. 6A, the circumferential direction represents the hue (H) (0 to 360), the height direction (vertical direction) represents the brightness (V), and the radial direction represents the saturation (S). As illustrated by the color ring of FIG. 6A and the color plane of FIG. 6B, red (R), green (G), and blue (B) are classified by hue value. The hue value is a value from 0 to 360. In the present embodiment, regions in which the hue value is from 105 to 180 are determined to be green, regions in which the hue value is from 180 to 255 are determined to be blue, and regions in which the hue value is from 330 to 30 are determined to be red.

The decoder 236 controls so as to decode bit data rows corresponding to each of the red (R), green (G), and blue (B) colors estimated by the estimator 234, and acquires the ID or the like of the mobile device 100 that is information to be communicated in the visible light communication.

Figure 7:
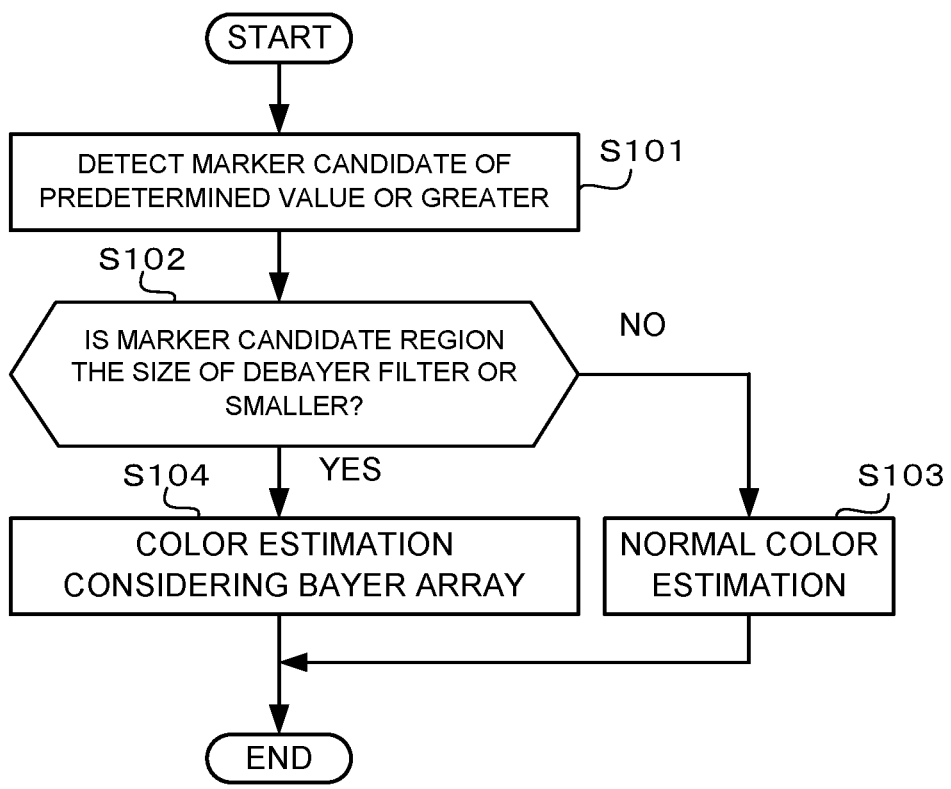
FIG. 7 is a flowchart illustrating an example of the operations of color estimation by the server according to the embodiment.

Hereinafter, the operations of the color estimation are described while referencing flowcharts. FIG. 7 is a flowchart illustrating an example of the operations of color estimation by the server 200.

The position identifier 232 in the controller 202 detects, as the region configured as the marker candidate, a region of the light receiving surface that has a predetermined brightness or higher that can be regarded as the position of light emission of the LED 102 in the mobile device 100 (step S101).

Next, the estimator 234 determines whether the marker candidate region is the size of a DeBayer filter or smaller (step S102). In the present embodiment, when the marker candidate region is the size of a DeBayer filter or smaller, there is a high possibility that the color of the marker candidate region will be identified in a manner biased toward one of the red filter 302, the green filter 304, and the blue filter 306 of the color filters. As such, in such cases, it is thought to be impossible to accurately determine the color of the marker candidate region by normal color determination.

When the marker candidate region exceeds the size of a DeBayer filter (step S102; NO), the color estimator 234 carries out normal color estimation for the marker candidate region (step S103). Specifically, the color estimator 234 carries out color estimation for the color of the marker candidate region on the basis of the red (R), green (G), and blue (B) values (RGB values).

However, when the marker candidate region is the size of a DeBayer filter or smaller (step S102; YES), the color estimator 234 carries out color estimation that takes the Bayer array of color filters of the light receiving surface into consideration (step S104). Hereinafter, the operations of step S104 are described in detail.

Figure 8:
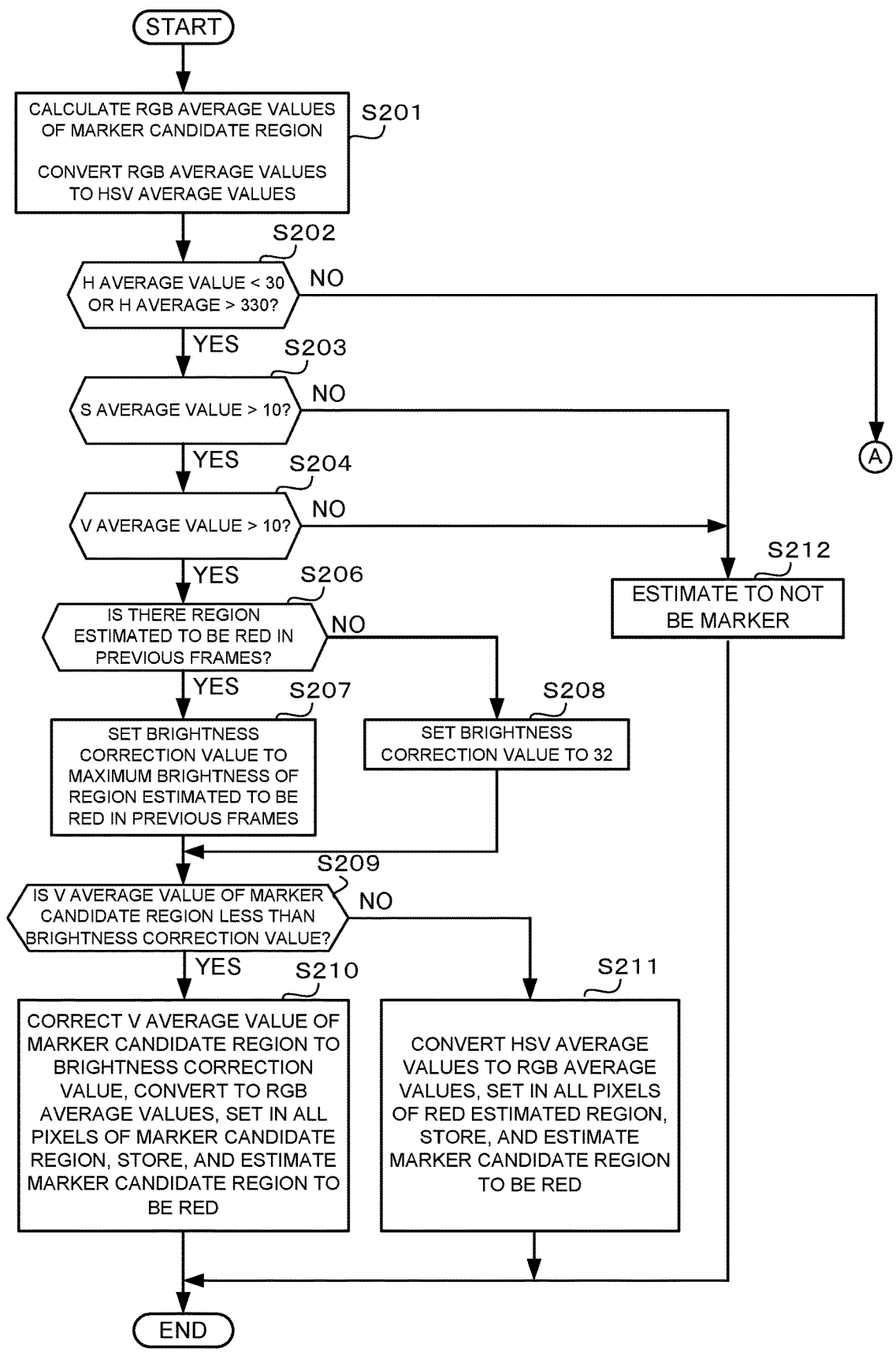
FIG. 8 is a flowchart illustrating a detailed example of a first operation of the color estimation by the server according to the embodiment.
Figure 9:
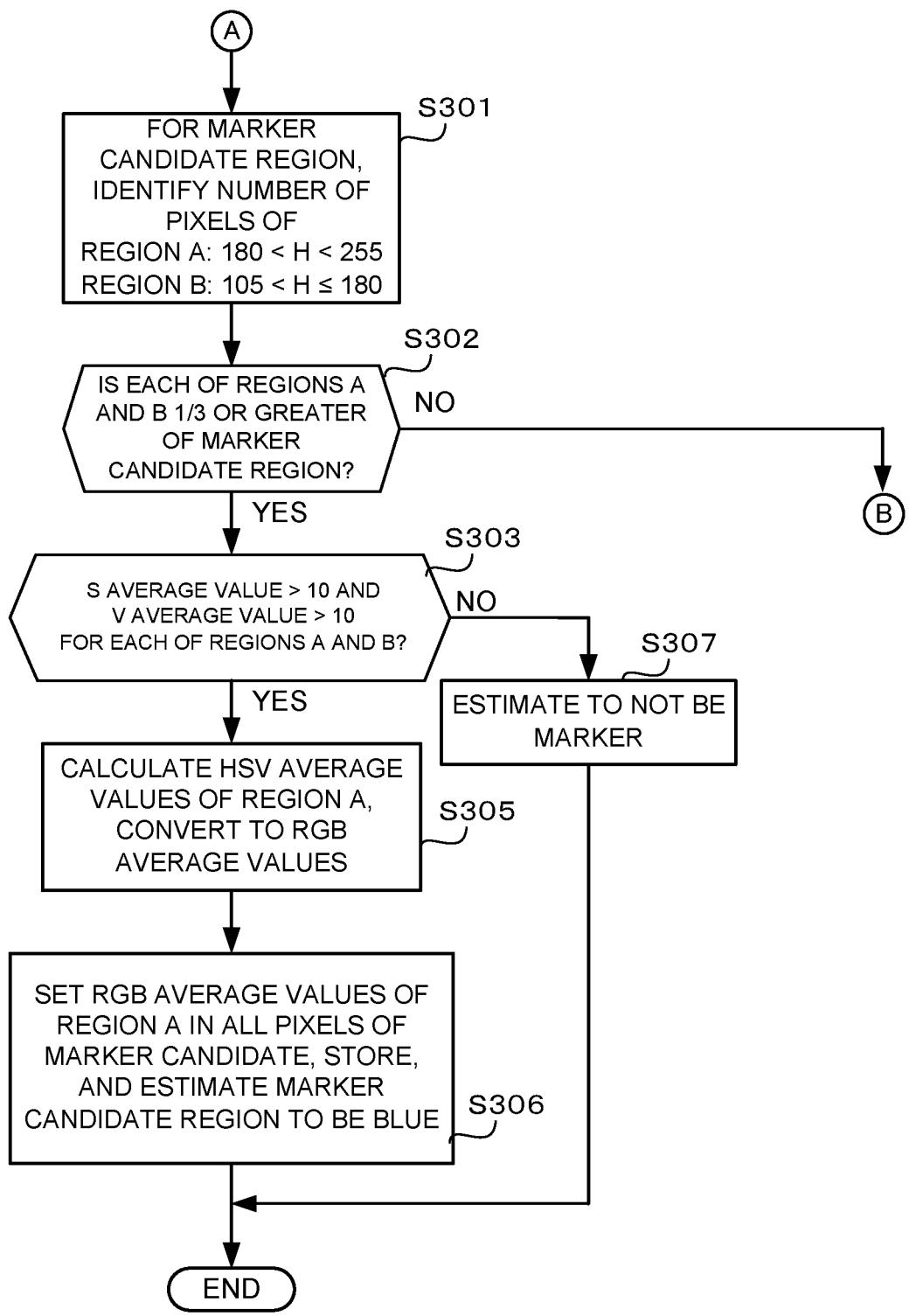
FIG. 9 is a flowchart illustrating a detailed example of a second operation of the color estimation by the server according to the embodiment.
Figure 10:
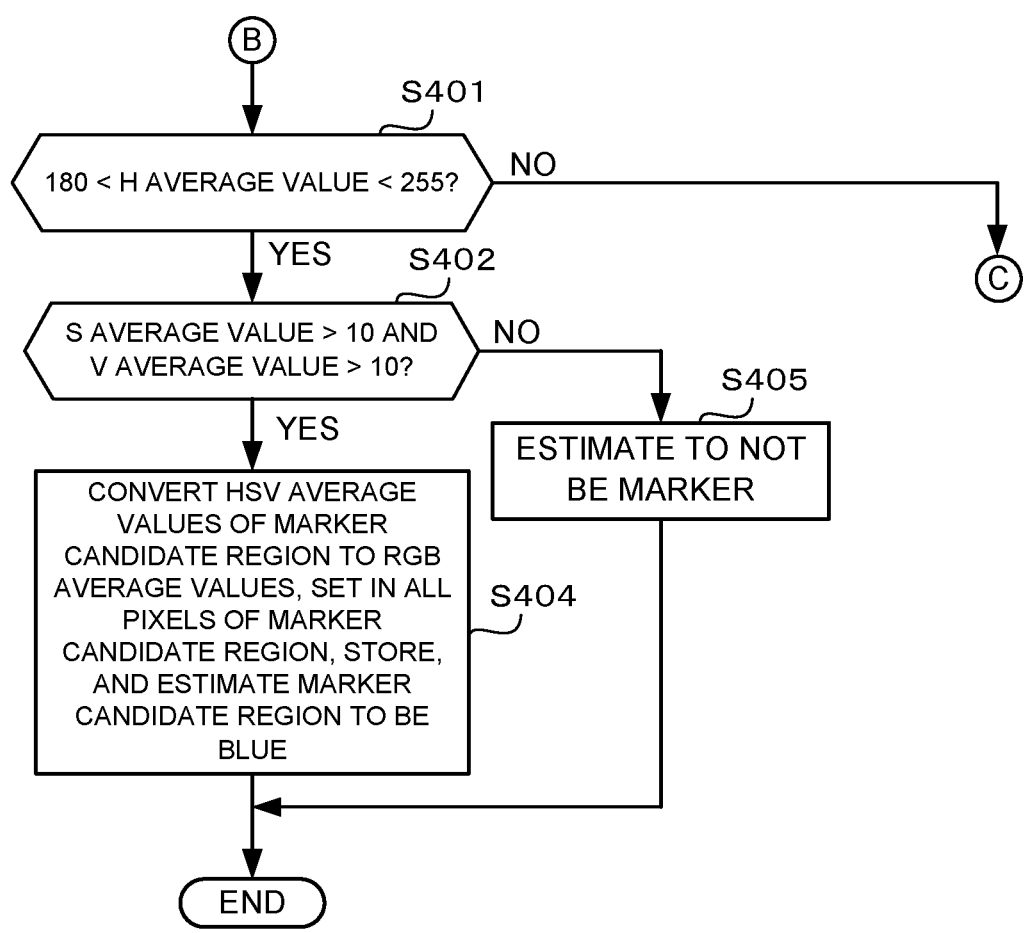
FIG. 10 is a flowchart illustrating a detailed example of a third operation of the color estimation by the server according to the embodiment.

FIG. 8 is a flowchart illustrating a detailed example of a first operation of the color estimation by the server 200, FIG. 9 is a flowchart illustrating a detailed example of a second operation of the color estimation by the server 200, FIG. 10 is a flowchart illustrating a detailed example of a third operation of the color estimation by the server 200, and FIG. 11 is a flowchart illustrating a detailed example of a fourth operation of the color estimation by the server 200.

Firstly, as illustrated in FIG. 8, the estimator 234 calculates average values (RGB average value values) of the red (R), green (G), and blue (B) values of all pixels included in the marker candidate region and converts the pixel format to convert the RGB average values to HSV average values consisting of an average value of the hue H (H average value), an average value of the saturation S (S average value), and an average value of the brightness V (V average value) of all of the pixels included in the marker candidate region (step S201).

Next, the estimator 234 determines whether the H average value <30 or the H average value >330 (step S202). The H average value <30 or the H average value >330 means that a region estimated to be red is extracted as the marker candidate. When the H average value <30 or the H average value >330 (step S202; YES), the estimator 234 determines whether the S average value >10 (step S203). The S average value >10 means that a region that has a high saturation S is extracted as the marker candidate. When the S average value >10 (step S203; YES), the estimator 234 determines whether the V average value >10 (step S204). The V average value >10 means that a region that has a high brightness V is extracted as the marker candidate.

When the V average value >10 (step S204; YES), the estimator 234 determines whether, in frames prior to the frame of the image that is currently the target of the color estimation, there is a region of a marker candidate at the same location as the present time that is estimated to be red (step S206). In one example, the hue H, the saturation S, the brightness V, and the like that are the results of the color estimation of the marker candidate region for each frame are stored in the memory 205.

When, in the previous frames, there is a marker candidate region that is estimated to be red (step S206; YES), the estimator 234 sets a brightness correction value to the maximum brightness in the marker candidate region estimated to be red in the previous frames (step S207). Meanwhile when, in the previous frames, there is not a marker candidate region estimated to be red (step S206; NO), the estimator 234 sets the brightness correction value to 32 (step S208). Here, the brightness correction value of 32 represents a value (emission brightness value) estimated when the LED 102 that is the marker emits light.

After the brightness correction value is set in step S207 or step S208, the estimator 234 determines whether the V average value of the marker candidate region is less than the brightness correction value (step S209). When the V average value of the marker candidate region is less than the brightness correction value (step S209; YES), the estimator 234 corrects the V average value of the marker candidate region to the brightness correction value set in step S207 or step S208. As a result, the V average value of the HSV average values is corrected to a larger value. Next, the estimator 234 converts the corrected HSV average values to RGB average value values. Furthermore, the estimator 234 sets the RGB average values in all of the pixels of the marker candidate region, stores the HSV average values and the RGB average values in the memory 205, and estimates that the marker candidate region is red (step S210).

However, when the V average value of the marker candidate region is not less than the brightness correction value (step S209; NO), the estimator 234 converts the pixel format to convert the HSV average values to RGB average value values. Furthermore, the estimator 234 sets the RGB average values in all of the pixels of the marker candidate region, stores the HSV average values and the RGB average values in the memory 205, and estimates that the marker candidate region is red (step S211).

When the S average value >10 is not satisfied (step S203; NO), or the V average value >10 is not satisfied (step S204; NO), the estimator 234 estimates that the marker candidate region is not a marker (step S212). When the H average value <30 or the H average value >330 is not satisfied (step S202; NO), the operations of FIG. 9 are executed.

The estimator 234 determines the hue H for all of the pixels (in this case, the size of the largest DeBayer filter) included in the marker candidate region, and identifies a number of pixels of a region A in which the hue H is 180<H<255, and a number of pixels of a region B in which the hue H is 105<H≤180 (step S301). 180<H<255 represents hue values that correspond to blue, and 105<H≤180 represents hue values that correspond to green.

Next, the estimator 234 determines whether the number of pixels of each of the region A and the region B is ⅓, or greater, of the number of pixels of all regions of the marker candidate (step S302). When the numbers of pixels of the region A and the region B are ⅓, or greater, of the number of pixels of all regions of the marker candidate (step S302; YES), the estimator 234 calculates the average value of the saturation S (S average value) and the average value of the brightness V (V average value) of each of the region A and the region B, and determines whether the S average value >10 and the V average value >10 in the region A, and the S average value >10 and the V average value >10 in the region B (step S303).

When the average value S of the saturation S >10 and the average value of the brightness V >10 in the region A and the region B (step S303; YES), next, the estimator 234 calculates HSV average values (HSV average values of region A) consisting of the average value of the hue H (H average value), the average value of the saturation S (S average value), and the average value of the brightness V (V average value) of all of the pixels included in the region A. Furthermore, the estimator 234 converts the pixel format to convert the HSV average values of the region A to RGB average values of the region A (step S305).

Furthermore, the estimator 234 sets the RGB average values of the region A in all of the pixels of the marker candidate region, stores the HSV average values and the RGB average values in the memory 205, and estimates that the marker candidate region is blue (step S306).

When the S average value >10 and the V average value >10 are not satisfied in the region A and the region B (step S303; NO), the estimator 234 estimates that the marker candidate region is not a marker (step S307). When the number of pixels of the marker candidate region in either the region A or the region B is not ⅓ of the total number of pixels or greater (step S302; NO), the operations of FIG. 10 are executed.

After step S308, the operations of FIG. 10 are executed, and the estimator 234 determines whether the H average value, included in the HSV average values of the marker candidate region acquired in step S201 of FIG. 8, satisfies 180<H average value <255 (step S401).

When 180<H average value <255 (step S401; YES), the estimator 234 determines whether the S average value >10 and the V average value >10 for the S average value and the V average value of the marker candidate region (step S402).

When the S average value >10 and the V average value >10 (step S402; YES), next, the estimator 234 converts the pixel format for the marker candidate region to convert the HSV average values to RGB average value values. Furthermore, the estimator 234 sets the RGB average values in all of the pixels of the marker candidate region, stores the HSV average values and the RGB average values in the memory 205, and estimates that the marker candidate region is blue (step S404).

However, when the S average value >10 and the V average value >10 are not satisfied (step S402; NO), the estimator 234 estimates that the marker candidate region is not a marker (step S405). When 180<H average value <255 is not satisfied (step S401; NO), the operations of FIG. 11 are executed.

The estimator 234 determines whether the H average value, included in the HSV average values of the marker candidate region acquired in step S201 of FIG. 8, satisfies 105<H average value ≤180 (step S501).

When 105<H average value ≤180 is satisfied (step S501; YES), the estimator 234 determines whether the S average value >10 and the V average value >10 for the S average value and the V average value of the marker candidate region (step S502).

When the S average value >10 and the V average value >10 (step S502; YES), next, the estimator 234 converts the pixel format for the marker candidate region to convert the HSV average values to RGB average value values. Furthermore, the estimator 234 sets the RGB average values in all of the pixels of the marker candidate region, stores the HSV average values and the RGB average values in the memory 205, and estimates that the marker candidate region is green (step S504).

However, when 105<H average value ≤180 is not satisfied (step S501; NO), or S average value >10 and V average value >10 are not satisfied (step S502; NO), the estimator 234 estimates that the marker candidate region is not a marker (step S505).

Thus, in the present embodiment, the mobile device 100 causes the LED 102 that is the marker to emit light in accordance with the ID or the like of the mobile device 100. Meanwhile, the server 200 detects the position of the marker region in the light receiving surface and estimates the color of the region of that marker. Furthermore, the decoder 236 of the server 200 decodes to information such as the ID or the like of the mobile device 100 on the basis of changes of the estimated color of the marker region.

However, when the marker region in the light receiving surface is smaller than a predetermined range of the color filters (for example, the various filters, namely the red filter 302, the green filter 304, and the blue filter 306), there are cases in which it is not possible to correctly estimate the color of the marker region as-is. In such a case, in the present embodiment, the server 200 estimates the color of the marker candidate region differently than in normal color estimation processing. Specifically, the server 200 considers the Bayer array of color filters and estimates the color of the marker candidate region using the HSV average values that are the average values of the hues H, the saturations S, and the brightness V of the pixels of the marker candidate region. Furthermore, the server 200 appropriately corrects the HSV average values and converts the pixel format to convert the HSV average values to RGB average value values, and sets the RGB average values in all of the pixels of the marker region. Thus, the correct color can be estimated regardless of the size of the marker region.

Note that the present disclosure is not limited by the description and drawings of the embodiment described above, and modifications and the like can be made, as appropriate, to the embodiment and drawings.

For example, in the embodiment described above, as illustrated in FIG. 9, the marker candidate region is estimated to be blue when ⅓ or greater of each of the region A where 180<H<255 and the region B where 105<H≤180 exist in the marker candidate region. However, the present disclosure is not limited thereto, and a configuration is possible in which, depending on the characteristics of the light receiving element-like color filters and processings such as white balancing and the like, the marker candidate region is determined to be green or is determined to be a color other than blue or green.

For example, in the embodiment described above, the information to be transmitted by the mobile device 100 is the ID of that mobile device 100, but the present disclosure is not limited thereto, and a configuration is possible in which the information to be transmitted is position information of the mobile device 100 or information about a failure that has occurred in the mobile device 100.

In the embodiment described above, a case is described in which red, green, and blue light, which are visible light, are used in the communication, but a configuration is possible in which visible light of other colors is used. Additionally, the emission light is not limited to light for which the hue and brightness changes over time, and a configuration is possible in which the emission light is light for which the saturation changes over time.

The light source in the mobile device 100 is not limited to an LED. For example, a configuration is possible in which a light source is configured in a portion of an LCD, a PDP, an EL display or the like of a display device.

Provided that the server 200 includes an imager and that imager can carry out imaging, any type of device may be used.

In the embodiment described above, a configuration is possible in which the program to be executed is stored and distributed on a non-transitory computer-readable recording medium such as a flexible disc, a compact disc read-only memory (CD-ROM), a digital versatile disc (DVD), a magneto-optical (MO) disc, or the like, and a system that executes the processing described above is configured by installing that program.

A configuration is possible in which the program is stored in a disc device or the like of a predetermined server on a network such as the internet or the like, and downloaded or the like by being superimposed on a carrier wave, for example.

Note that, in cases in which the functions described above are realized in part by an operating system (OS), or the functions are realized by cooperation between an OS and an application, it is possible to store and distribute only the portion other than the OS on the medium, or download or the like the portion other than the OS.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present application is applicable to the technical field of communication using colors of light, and the like.

REFERENCE SIGNS LIST

1 Visible light communication system
100, 100a, 100b, 100c Mobile device
102, 102a, 102b, 102c LED
103, 202 Controller
104, 205 Memory
108, 208 Communicator
112 Driver
124 Light emission controller
150 Battery
200 Server
201 Imager
203 Lens
204 Image processor
206 Operator
207 Display
232 Position identifier
234 Estimator
236 Decoder
302 Red filter
304 Green filter
306 Blue filter
310 Marker candidate region

The invention claimed is:

1. A color estimation device, comprising:
   a light receiver with a plurality of arranged light receiving elements for which a color to which received light belongs is identified from a light receiving position; and
   at least one processor, wherein the at least one processor is configured to
   estimate, in a case in which a position of the light receiving element having received light is a position other than where the color to which the received light belongs is identifiable, a color to which the light belongs, based on a brightness of the received light.

2. The color estimation device according to claim 1, wherein the at least one processor is configured to:
   perform, by correcting the brightness of the light that is, after the estimation by the at least one processor, at a position of the light receiving element having received light to increase the brightness, control so as to facilitate identification of the color to which the light at the position of the light receiving element belongs.

3. The color estimation device according to claim 1, wherein a case in which the position of the light receiving element having received light is the position other than where the color to which the received light belongs is identifiable includes a case in which there are two or more light receiving elements having received light and the light receiving elements are adjacent to each other.

4. The color estimation device according to claim 3, wherein in a case in which there are the light receiving elements having received light and the light receiving elements having received light are adjacent to each other, the at least one processor determines that a plurality of colors is included in the color to which the light belongs and further estimates, based on information of color space including a hue ring as a parameter, the color to which the light belongs.

5. The color estimation device according to claim 1, further comprising:
   a color filter in which a transparent member through which light in a wavelength band corresponding to each of three primary colors passes is regularly arranged so as to correspond to each position of the plurality of arranged light receiving elements; wherein
   the color to which the light belongs is identified based on a type of the wavelength band of the light that passes through the transparent member.

6. The color estimation device according to claim 1, wherein the at least one processor is configured to:
   decode from the color estimated by the at least one processor to information for use in a communication system that modulates information to color to communicate.

7. A color estimation method, comprising:
   receiving light by a plurality of arranged light receiving elements for which a color to which received light belongs is identified from a light receiving position; and
   in a case in which a position of the light receiving element having received light in the receiving is a position other than where the color to which the received light belongs is identifiable, estimating a color to which the light belongs, based on a brightness of the received light.

8. The color estimation method according to claim 7, further comprising:
   performing, by correcting the brightness of the light that is, after the estimating, at a position of the light receiving element having received light to increase the brightness, control so as to facilitate identification of the color to which the light at the position of the light receiving element belongs.

9. The color estimation method according to claim 7, wherein a case in which the position of the light receiving element having received light is the position other than where the color to which the received light belongs is identifiable includes a case in which there are two or more light receiving elements having received light and the light receiving elements are adjacent to each other.

10. The color estimation method according to claim 9, further comprising:
    in a case in which there are the light receiving elements having received light and the light receiving elements having received light are adjacent to each other, determining that a plurality of colors is included in the color to which the light belongs and further estimating, based on information of color space including a hue ring as a parameter, the color to which the light belongs.

11. The color estimation method according to claim 7, further comprising:
    identifying, based on a type of a wavelength band of light that passes through a transparent member, color to which the light belongs, the transparent member being included in a color filter in which the transparent member through which light in a wavelength band corresponding to each of three primary colors passes is regularly arranged so as to correspond to each position of the plurality of arranged light receiving elements.

12. The color estimation method according to claim 7, further comprising: decoding from the color estimated in the estimating to information for use in a communication system that modulates information to color to communicate.

13. A non-transitory recording medium storing a program, the program causing a computer to function as:
    a light receiver with a plurality of arranged light receiving elements for which a color to which received light belongs is identified from a light receiving position; and
    an estimator to estimate, when a position of the light receiving element having received light is a position other than where the color to which the received light belongs is identifiable, a color to which the light belongs, based on a brightness of the received light.

* * * * *